United States Patent
Estevez-Schwarz et al.

(10) Patent No.: US 7,272,543 B2
(45) Date of Patent: Sep. 18, 2007

(54) METHOD AND COMPUTER SYSTEM FOR STRUCTURAL ANALYSIS AND CORRECTION OF A SYSTEM OF DIFFERENTIAL EQUATIONS DESCRIBED BY A COMPUTER LANGUAGE

(75) Inventors: Diana Estevez-Schwarz, Berlin (DE); Jochen Mades, Hemsbach (DE)

(73) Assignee: Infineon Technologies AG, Munich (DE)

( * ) Notice: Subject to any disclaimer, the term of this patent is extended or adjusted under 35 U.S.C. 154(b) by 959 days.

(21) Appl. No.: 10/273,520

(22) Filed: Oct. 18, 2002

(65) Prior Publication Data

US 2003/0084421 A1 May 1, 2003

(30) Foreign Application Priority Data

Oct. 18, 2001 (DE) .................. 101 50 914

(51) Int. Cl.
*G06F 7/60* (2006.01)
(52) U.S. Cl. .......................................... 703/2
(58) Field of Classification Search ............ 703/2
See application file for complete search history.

(56) References Cited

OTHER PUBLICATIONS

Peter Bunus and Peter Fritzson, "A Debugging Scheme for Declarative Equation Based Modeling Languages", Practical Aspects of Declarative Languages : 4th International Symposium, PADL 2002, Portland, OR, USA, Jan. 19-20, 2002, Springer.*
Peter Bunus and Peter Fritzson, "Methods for Structural Analysis and Debugging of Modelica Models", Proceedings of the 2nd International Modelica Conference, 2002, pp. 157-165.*
Alan Dolan and Joan Aldous, "Networks and algorithms: an introductory approach", 1993, John Wiley & Sons, pp. 31, 284-309.*
Armen S. Asratian et al.; "Bipartite Graphs and their Applications", 1998, Cambridge University Press, pp. v-xi, 1-22, 56-74, 174-191.*
Christian Bliek et al.; "Using Graph Decomposition for Solving Continuous CSPs", 1998, Proceedings of the 4th International Conference on Principles and Practice of Constraint Programming.*
Jochen Mades and Manfred Glesner, "Regularization of Hierarchical VHDL-AMS Models using Bipartite Graphs", Jun. 2002, Proceedings of the 39th Design Automation Conference, pp. 548-551.*

(Continued)

*Primary Examiner*—Paul Rodriguez
*Assistant Examiner*—Russ Guill
(74) *Attorney, Agent, or Firm*—Laurence A. Greenberg; Werner H. Stemer; Ralph E. Locher

(57) ABSTRACT

A method for structural analysis and correction of a system of differential equations described by a computer language is disclosed. A description of a physical system (in the form of equations, in particular differential equations) as a computer program in a computer system is included. Suitable bipartite graphs for examining the solubility of the equations are generated with the method. Erroneous descriptions can be determined and can possibly be corrected with the bipartite graphs. A computer system containing a computer-readable medium having computer-executable instructions for performing the method, and a corresponding data carrier are disclosed.

10 Claims, 8 Drawing Sheets

OTHER PUBLICATIONS

Alfred V. Aho et al.; "Data Structures and Algorithms", 1983, Addison-Wesley, pp. 246-250.*

Francois E. Cellier et al.; "Automated Formula Manipulation Supports Object-oriented Continuous-System Modeling", 1993, IEEE Control Systems, vol. 13, Issue 2, pp. 28-38.*

Constantinos C. Pantelides: "The Consistent Initialization Of Differential-Algebraic Systems", *SIAM J. Sci. Stat. Comput.*, vol. 9, No. 2, Mar. 1988, pp. 213-221.

Günther Reiβig et al.: "Computing The Generic Index Of The Circuit Equations Of Linear Active Networks", *Proceedings of the IEEE International Symposium on Circuits and Systems, IEEE*, 1996.

Boris V. Cherkassky et al.: "Augment or Push? A computational study of Bipartite Matching and Unit Capacity Flow Algorithms", *Technical Report 98-036R, NEC Research Institute, Inc.*, 1998.

* cited by examiner

```
1: entity sinus is
2:    port(quantity sout : out real);
3: end entity;

4: architecture behave of sinus is
5: begin
6:    E1: sout == 5.0 * sin(2.0*MATH_PI*1.0e6*NOW+MATH_PI/16.0);
7: end architecture;
```
⟵ 5

```
1: entity integrator is
2:    port(quantity inp : in real;
3:         quantity outp : out real);
4: end entity;

5: architecture behave of integrator is
6: begin
7:    E2: inp == outp'dot;
8: end architecture;
```
⟵ 6

FIG 4

```
1: entity example is                    ⟵7
2: end example;

3: architecture struct of example is
4:   quantity input, output : real;
5: begin
6:   SRC: entity work.sinus
7:     port map(input);
8:
9:   INT: entity work.integrator
10:    port map(input, output);
11: end architecture;
```

FIG 5

$$\begin{pmatrix} 1 & -1 & & & & \\ 1 & & -1 & & & \\ & 1 & & -1 & & \\ & & 1 & & & \\ & & & 1 & & -1 \\ & & & & & 1 \end{pmatrix} \begin{pmatrix} input \\ output \\ sout \\ inp \\ outp \\ outp'dot \end{pmatrix} = \begin{pmatrix} 0.0 \\ 0.0 \\ 0.0 \\ 5.0*\sin(\pi/16) \\ 0.0 \\ 0.0 \end{pmatrix}$$

⟵8

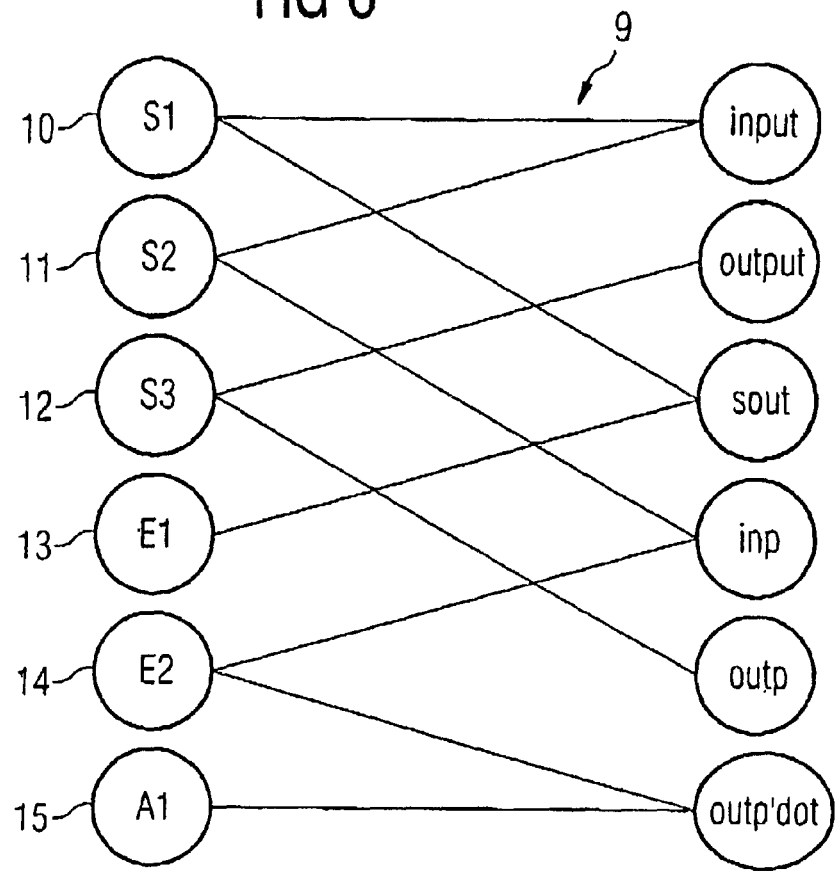
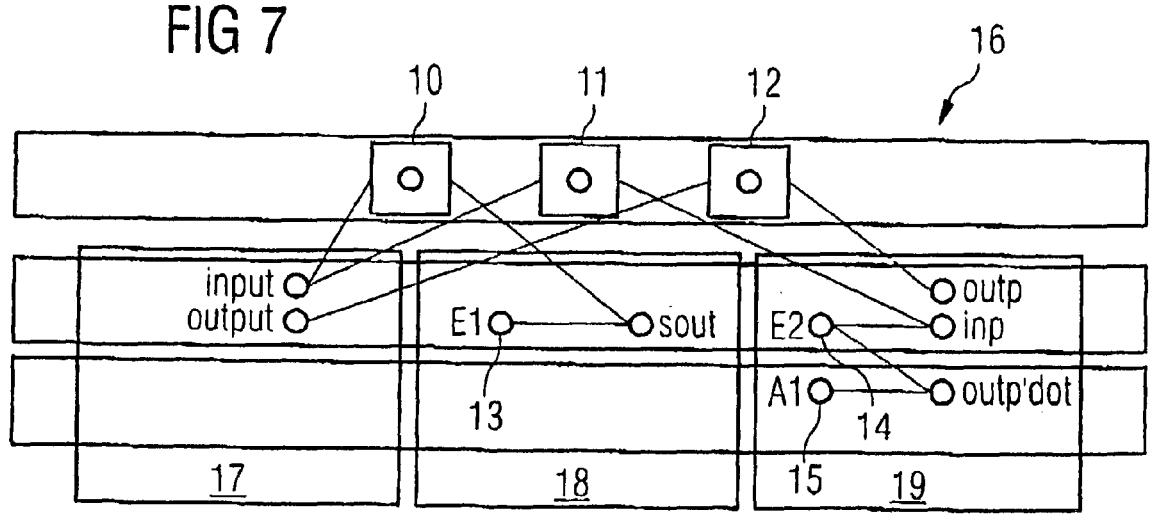

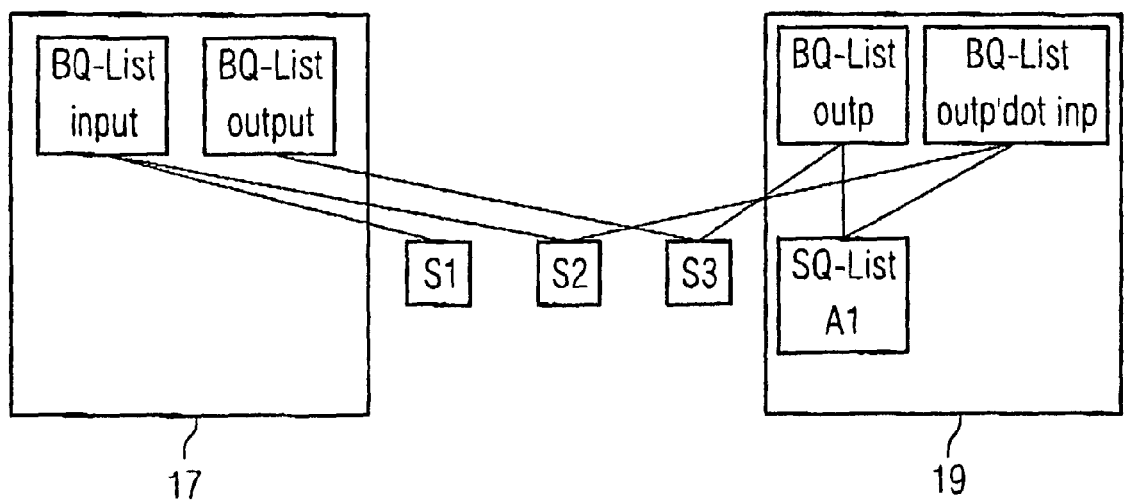
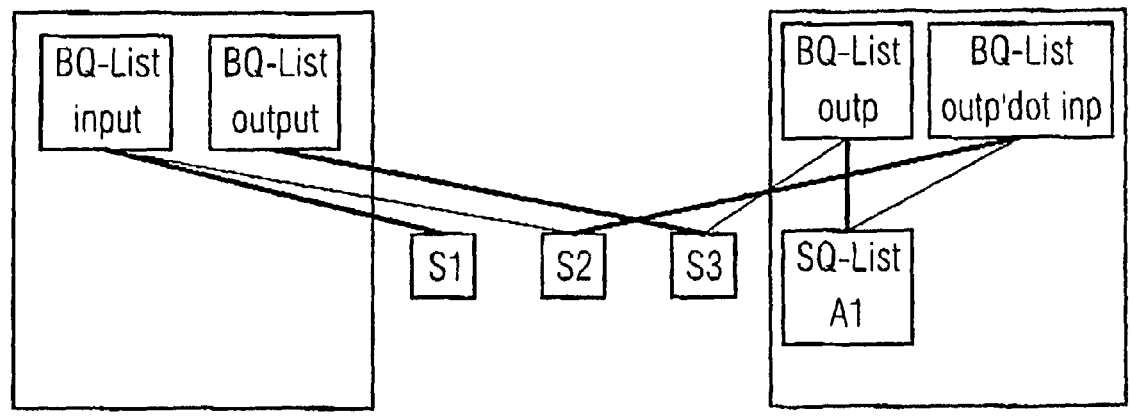

FIG 12

1: D:\SVE\work\Ams\patent> ivms example
2: VHDL-AMS Simulator Version 1.01(beta) - - Build(20010702.07A)
3: Copyright (c) 2000-2001, TU Darmstadt, TU Chemnitz, Infineon Technologies AG.
4: (Type "ivms" with no arguments for help)

5: Elaborating top level entity example (struct) ...
6: Executing simulator (timeout=2 µs)...
7: Standard Analysis...
8: System is NOT dc-solvable
9: Simulation aborded due to singular matrix.
10: Unknown : example (STRUCT) :OUTPUT (Column 4) is critical (DOMAIN = 0):

11: Analysing break statements...
12:   Searching maximal matchings...
13:   Searching maximal matchings DONE.
14:   Analysing component classes of scope SINUS...
15:   Analysing component classes DONE.
16:   Analysing component classes of scope INTEGRATOR...
17:   Analysing component classes DONE.
18:   Analysing component classes of scope example...
19:   Analysing component classes DONE.
20:   Regularizing system...
21:   Regularizing system DONE.
-----------------------------------------------
22: The BREAK ANALYSER has now determined several
23: break statements which will regularize your
24: model for quiescent state determination.

25: In interaction with you the break statements
26: will now be specified...

27:   1. break statement will be added to scope INTEGRATOR.
28:   * Specify the <VALUE> for the following break statement:
29:     break OUTP => <VALUE>
30: <VALUE>: 4. 0e-7                    !!!!!Interaction!!!!!

31: Analysing break statements DONE.
-----------------------------------------------
32: Should the corrected files now be compiled?
33: This will replace the (errorneous) design units with the corrected ones.
34: [Y/n] : n

```
1: entity integrator is
2:   port(quantity inp : in real;
3:        quantity outp : out real);
4: end entity;
```
↗ 25

```
5: architecture BEHAVE_BA1 of integrator is
6: begin
7:   i1: outp'dot == inp;

8: -- inserted by BREAK ANALYSER
9: -- (24.07.2001, 16:18:58)
10:   break OUTP => 4.0E-7;

11: end architecture;
```

$$\begin{pmatrix} 1 & -1 & & & & \\ 1 & & -1 & & & \\ \underline{1} & & & \underline{-1} & & \\ & 1 & & & & \\ & & & 1 & -1 & \\ & & & & 1 & \end{pmatrix} \begin{pmatrix} \text{input} \\ \text{output} \\ \text{sout} \\ \text{inp} \\ \text{outp} \\ \text{outp'dot} \end{pmatrix} = \begin{pmatrix} 0.0 \\ 0.0 \\ 0.0 \\ 5.0*\sin(\pi/16) \\ 0.0 \\ 4.0e-7 \end{pmatrix}$$

METHOD AND COMPUTER SYSTEM FOR STRUCTURAL ANALYSIS AND CORRECTION OF A SYSTEM OF DIFFERENTIAL EQUATIONS DESCRIBED BY A COMPUTER LANGUAGE

BACKGROUND OF THE INVENTION

Field of the Invention

The invention relates to a method and a computer system for analysis and correction of a system of differential equations described by a computer language. Various technical and physical systems (in particular electric circuits), which can be described by a large number of equations (in particular by differential equations), are often simulated on a computer system by using hardware description languages.

Simulators that solve the system of equations of a real technical or physical system are used. Such simulators are available as computer programs and use familiar numerical methods. The most familiar techniques for analyzing electrical systems include DC analysis and TR analysis. DC analysis is direct current analysis for finding a working point of the electrical system in the steady state. TR analysis constitutes a transient analysis for the "time simulation" of the system.

Erroneous descriptions of a technical or physical system frequently exhibit singular matrices. This generally leads to an error in the relevant analysis, in particular to convergence failure or simulation termination.

Manual detection of the position of such errors within the description of the technical or physical system, and manual correction of the description of the technical or physical system are very time-consuming and are even impossible, depending on the size and the dimension of the basic system of equations.

Customary simulators do not offer the user any support in characterizing or finding such errors in the description of the physical system. Furthermore, no customary simulators are known which use regularization routines to correct a system of differential equations described in a computer language.

In the prior art, structural diagnostic methods are known which use a bipartite graph which represents the occupancy of the system matrix for the analysis of errors in systems of equations (in particular, in systems of differential equations). Such diagnostic methods have previously not been used to correct errors in systems of differential equations.

SUMMARY OF THE INVENTION

It is accordingly an object of the invention to provide a method and a computer system for structural analysis and correction of a system of differential equations describing a physical system that overcome the hereinafore-mentioned disadvantages of the heretofore-known devices and methods of this general type. The system of differential equations is described in a computer language in a computer system.

With the foregoing and other objects in view, there is provided, in accordance with the invention, a method with which errors in the physical system can be detected reliably and can be determined unambiguously within the physical system.

According to the invention, a model or a description of a real physical system is considered.

The description of the real physical system is presented in the form of a computer program which describes the behavior of the system in the form of the system of equations or the system of differential equations. The computer program exists in a computer system. The programming languages used are often marked by speech characteristics, for example by visibility ranges or validity ranges of declarations.

Possible corrections for the errors within the described physical system can be made automatically by the computer program.

In the computer program, the basic real physical system is described by the system of equations which contains explicit and structural equations, and equations which characterize the dynamic variables, such as the "time derivatives" of a variable in the system of equations.

The method uses two bipartite graphs to treat the system of equations of the basic physical system.

The bipartite graphs can be compiled by using the information from the system of equations, and take into account the visibility ranges or the validity ranges of the computer language on which the description is based. A definition of the visibility ranges of the computer language is contained in Compilerbau [Compiler construction], volume 1, Oldenbourg, 1999 by A. V. Aho, R. Sethi and J. D. Ullman.

A bipartite graph is characterized by a large number of nodes and edges. The nodes of the bipartite graph are subdivided into two partitions. Each edge connects precisely one node in the first partition to precisely one further node in the second partition. Such a connection between two nodes by an edge states that a relationship is formed between the two nodes. In particular, it states that an unknown represented by the second node is contained in the equation represented by the second node.

Since specific equations of the system of equations of the real physical system are not formulated explicitly in the computer language, they do not belong to any visibility range of the basic computer language.

The visibility ranges of the bipartite graphs correspond to the visibility ranges of the basic computer language. In this embodiment, the visibility ranges of the bipartite graph in each case form a set of nodes of the bipartite graph, which represent an unknown or an equation in the basic computer language, which belongs to a visibility range of the basic computer language. The edges of the bipartite graph are characterized by the fact that they are placed either within one or between several visibility ranges.

Matching deals with a set of independent edges of a bipartite graph in which each node is presented with an edge. A node is matched when an edge which belongs to the matching is attached to it. Maximum matching within a bipartite graph occurs when the number of matched nodes within the bipartite graph is formed as a maximum.

In the first step of the method, the equations are classified. Three types of equations are distinguished herein. The first equation type, the explicit equations, corresponds to the equations used in the computer program to describe the physical system. The second equation type, the structural equations of the system of differential equations, represents the conservation equations of the physical system. The third equation type corresponds to the equations in the system of equations which describe the dynamic variables of the physical system. These equations may be modified under specific conditions and are used for the structural regularization of the system of differential equations in the method. This equation type is referred to as a "modifiable equation".

A first bipartite graph is then produced on the basis of such a system of equations. A node is set up in the first partition for each equation of the system of equations. A node is set up in the second partition of the first bipartite graph for each unknown in the system of equations. The relevant nodes for every unknown, which is contained in a corresponding equation, are connected by an edge.

The visibility ranges of the basic computer language are taken into account (when setting up the first bipartite graph) by the nodes being assigned to the visibility ranges in the bipartite graph which correspond to the visibility ranges of the basic unknowns and equations in the computer language.

The nodes of the structural equations, which generally have unknowns of several visibility ranges, are placed outside the visibility ranges of the bipartite graph.

In the next step of the method of the invention, the nodes and edges of the structural equations are removed from the first bipartite graph. A maximum matching is determined for the first bipartite graph changed in this way. In this case, standard matching algorithms are used.

According to one embodiment, the relationship components of the changed first bipartite graph can also be considered. A definition of relationship components is contained in Graphen, Netzwerke und Algorithmen [Graphs, networks and algorithms], Progressdruck GmbH, Speyer, 1994 by D. Jungnickel.

A second bipartite graph is then set up on the basis of the first bipartite graph.

Accordingly, the method uses the first bipartite graph and the characteristics of the maximum matching of the changed first bipartite graph to set up the second bipartite graph, which is used to correct and to regularize the basic system of equations.

The first partition of the second bipartite graph contains nodes which combine sets of determined, modifiable equation nodes from the first bipartite graph, and the structural equation nodes.

The second partition of the second bipartite graph is formed of nodes which combine sets of determined unknown nodes from the first bipartite graph.

The visibility ranges are taken into account in the second bipartite graph (as in the first bipartite graph), and are transferred to the second bipartite graph. The visibility ranges of the second bipartite graph correspond to the visibility ranges of the first bipartite graph.

For each unmatched node of the first bipartite graph corresponding to a modifiable equation, a node is inserted (in each case) into the visibility range of the second bipartite graph which contains the corresponding node from the first bipartite graph. Such nodes belong to the first partition of the second bipartite graph and are designated selector quantity nodes according to one embodiment.

A node is inserted (in each case) into the second bipartite graph for each unmatched node in the first bipartite graph which corresponds to an unknown. This node is placed in the visibility range which contains the corresponding node from the first bipartite graph. Such nodes belong to the second partition of the second bipartite graph and, according to one embodiment, are designated break quantity nodes.

In addition, further modifiable equation nodes and further unknown nodes of the first bipartite graph are determined, and the selector quantity nodes and the break quantity nodes from the second bipartite graph are appended. Alternate paths are used herein.

An alternate path exists in a bipartite graph when a coherent path formed of edges belongs alternately to a matching.

The determination of further modifiable equation nodes is carried out following the production of selector quantity nodes in the second bipartite graph for unmatched nodes from the first bipartite graph. Further modifiable equation nodes are appended to the corresponding selector quantity nodes of the first partition of the second bipartite graph. The starting point is the unmatched node corresponding to the modifiable equation in the first bipartite graph and belonging to the selector quantity node. All of the nodes which represent modifiable equations and which can be reached via alternate paths are appended to the selector quantity node of the first partition of the second bipartite graph.

Moreover, further unknown nodes are determined, which are appended to the corresponding break quantity nodes of the second partition of the second bipartite graph. A further unknown node from the first bipartite graph is appended to the break quantity node of the second bipartite graph by starting from the unmatched node of the break quantity node, which corresponds to the unknown in the first bipartite graph, and by following alternate paths.

In this embodiment, several valid alternative nodes of the first bipartite graph can be determined simply and reliably via alternate paths. These alternative nodes, together with the nodes originally found, are (in each case) combined by a node of the second bipartite graph.

In the next step, the edges of matched, modifiable equation nodes from the first bipartite graph are selected and deleted from the first bipartite graph.

Consequently, the first bipartite graph reduced in this way has an unmatched modifiable equation node and an additional unmatched unknown node.

According to one embodiment, a selector quantity node is produced in the first partition of the second bipartite graph for the unmatched, modifiable equation node produced by the deletion of the matching edge. The visibility range of this selector quantity node corresponds to the visibility range of the selected unmatched equation node in the first bipartite graph.

A further set of unknown nodes has to be determined, which is, represented by a break quantity node (according to one embodiment) in the second partition of the second bipartite graph by starting from the unmatched unknown node, which has been produced previously by deleting the matching edge. The visibility range of this break quantity node corresponds to the visibility range of the unmatched unknown node of the first bipartite graph.

This newly determined break quantity node has the unmatched unknown node (which has previously been produced by the deletion of the matching edge) and also the unknown nodes which can be reached from the unmatched unknown node via alternate paths.

Additional degrees of freedom for the regularization are provided by this step of the method of the invention.

The step of inserting the break quantity nodes can also be carried out before the step of inserting the selector quantity nodes.

The steps of determining the unmatched nodes corresponding to a modifiable equation and belonging to the first bipartite graph; producing a selector quantity node in each case for the first partition of the second bipartite graph for each node determined,in the previous step; determining further nodes in the first bipartite graph which correspond to a modifiable equation, by following alternate paths; and appending the nodes determined in the previous step from the first bipartite graph to the selector quantity nodes previously produced in the first partition of the second bipartite graph form a first section of the method according to the invention.

The steps of determining the unmatched nodes, corresponding to an unknown, in the first bipartite graph; producing a break quantity node in each case for the second partition of the second bipartite graph for each node determined in the previous step; determining further nodes in the first bipartite graph which correspond to an unknown, by following alternate paths, starting from the nodes previously determined; and appending the nodes determined in the previous step and belonging to the first bipartite graph to the break quantity nodes previously produced and belonging to the second bipartite graph form a second section of the method according to the invention.

The steps of determining the matched nodes, corresponding to a modifiable equation, in the first bipartite graph; deleting the matching edge of the nodes determined in the previous step; producing a selector quantity node in each case for the first partition of the second bipartite graph for the previously determined nodes of the first bipartite graph; producing a break quantity node in each case for the second partition of the second bipartite graph for each unmatched node corresponding to an unknown in the first bipartite graph, which has been produced by the deletion of the matching edge; determining further nodes in the first bipartite graph which correspond to an unknown, by following alternate paths, starting from the unmatched nodes corresponding to an unknown in the first bipartite graph, and appending the node determined in the previous step and belonging to the first bipartite graph to the previously produced nodes of the second bipartite graph form a third section of the method according to the invention.

The sequence of the three sections within the method according to the invention can be altered as desired. For example, the steps of the second section can be carried out first, the steps of the third section can then follow, and the steps of the first section can be carried out last.

In a next step of the method according to the invention, a node is inserted into the first partition of the second bipartite graph for each structural equation (in each case). These nodes are located outside the visibility ranges of the second bipartite graph.

Then, the nodes of the first partition are connected to the nodes of the second partition by edges if they are placed in the respectively equal visibility range.

The step of connecting the nodes of the first partition by edges to the nodes of the second partition can also be carried out before the step of inserting a node in each case for each structural equation in the first partition of the second bipartite graph.

Then, the nodes of the structural equations are connected by edges to break quantity nodes of the second partition if one of the unknowns represented by the break quantity node is contained in the respectively relevant structural equation.

A maximum matching is determined for the complete second bipartite graph produced in this way. Standard matching algorithms are used herein.

In accordance with another mode of the invention, the system of equations can be regularized if the maximum matching of the second bipartite graph is a perfect matching. A perfect matching is a matching in which all the nodes are matched.

The edges of the perfect matching of the second bipartite graph represent the possible language constructs needed for regularization. "Regularization" is defined as the transformation of the unsolvable system of equations into a solvable system of equations.

If no perfect matching can be found in the second bipartite graph, then the description of the physical system cannot be regularized merely by changing the modifiable equations. In this case, the method according to the invention, supplies the unknowns and equations which cause the structural insolubility of the system of equations.

If a perfect matching can be found in the second bipartite graph, then (in the next step), a determination is made of the edges which belong to the perfect matching and which are located between the break quantity nodes of the second partition and the selector quantity nodes of the first partition of the second bipartite graph.

Then, the procedure (for each edge determined in the previous step) is performed as follows:

A value is fixed for an unknown selected from the set of unknown nodes of the relevant break quantity node. This value may be predefined by a user by interacting with the computer program.

The modifiable equation selected from the set of modifiable equation nodes of the associated selector quantity node and belonging to the system of equations is then improved in the description of the physical system, in particular in the source code of the computer program.

The modifiable equation selected from the selector quantity node is replaced by an equation, which has the selected unknown of the break quantity node determined in the previous step and also has the value for this unknown determined in the previous step.

The aforementioned steps (according to the other mode of the invention) are repeated for each further edge (which is located between the break quantity nodes of the second partition and the selector quantity nodes of the first partition of the second bipartite graph) in the perfect matching. The respectively previously selected modifiable equations and the respectively previously selected unknowns are taken into account during the repetition of these steps.

The step of selecting a modifiable equation from the nodes (of the first partition of the second bipartite graph) which are connected by the previously determined edges of the perfect matching can also be carried out after the step of selecting an unknown from the nodes (of the second partition of the second bipartite graph) which are connected by the previously determined edges of the perfect matching. Alternatively, the step may be carried out after the step of defining a numerical value for the unknown selected in the previous step.

The correction of the description of the physical system is carried out with the computer program by appending, changing or removing special language constructs, which permit the modification of the modifiable equations.

The language constructs (designated as "break statements" according to one embodiment) are inserted at the corresponding point in the computer program, and may be changed or removed.

Other language constructs can also be provided for supplementing and correcting the description of the physical system.

The system of equations is regularized by "correction" in this way. In other words, the structural solubility of the system of equations is provided by the changes made in this way.

According to a concept of the invention, structurally unsolvable systems of equations (in particular, differential equations of physical systems) can be analyzed and possibly corrected or regularized structurally by changing specific equations.

According to another concept, the method takes the speech characteristics of the programming language used (to describe the basic physical system) into account. As a result, a suitable bipartite graph can be provided with which the equation system describing the basic physical system can possibly be corrected or regularized structurally.

In contrast to the conventional structural methods, the method of the present invention distinguishes the type of the nodes of the bipartite graph into nodes of explicit equations, nodes of structural equations and nodes of equations, which may be modified by explicit language constructs.

Applying the matching algorithms to suitable bipartite graphs ensures that the regularization leads to a structurally solvable system.

The method according to the invention therefore provides an advantageous possible way of analyzing and correcting systems of equations, which may be used for describing any desired physical system.

Descriptions of physical systems (if possible) can be corrected in a very specific manner by the method of the invention.

The method according to the invention is a fast structural method which uses efficient matching algorithms.

Furthermore, the method according to the invention can automatically carry out a possible correction of the description of the physical system (in particular the correction of the source code or of the computer program describing the physical system).

In accordance with a further mode of the invention, the physical system is an electric circuit. The circuit has one or more interconnected circuit elements. The method may be employed particularly advantageously in the analysis and correction of images of electric circuits.

In accordance with an added feature of the invention, the computer program which is used (in the computer system) for describing the physical system is coded in a hardware description language.

In accordance with an additional mode of the invention, analog and mixed-signal hardware description languages (in particular, the hardware description languages "VHDL-AMS" or "Verilog AMS") are used.

Such hardware description languages make it possible to model any desired physical processes in the form of equations. The hardware description language represents only a qualified restriction (in the description of physical systems) on such a computer program, so that the described behavior of physical systems can lead to unsolvable systems of equations.

As a result of the method according to the invention, the possibility of regularization, which is provided by the language constructs of the hardware description language, is advantageously utilized. The method according to the invention particularly advantageously supports characteristics of the basic hardware description language. At the same time, possible restrictions of the hardware description language, such as visibility ranges, are taken into account.

The hardware description language "VHDL-AMS" provides a particularly comprehensive and particularly flexible library of predefined language constructs which are used particularly advantageously for the method of the invention. A description of the language constructs of the hardware description language "VHDL-AMS" is contained in IEEE standard 1076.1-1999, VHDL Language Reference Manual, IEEE, 1999 by "The Institute of Electrical and Electronics Engineers".

With the objects of the invention in view, there is also provided a computer system containing a computer-readable medium having computer-executable instructions for performing the method. The invention is implemented in a computer program for carrying out a method for analysis and correction of a description of a physical system.

The computer program is constructed in such a way that a method according to the invention in an embodiment described above can be carried out after the description of the physical system has been entered. As a result of the method, a statement can be made as to whether or not the description of the basic physical system can be improved by supplementing or changing language constructs. Ideally, the description of the basic system of equations can be regularized by appending or changing specific language constructs. If the system of equations on which the description is based cannot be regularized, a detailed output of the equations and unknowns having structural violations is made in a manner analogous to conventional methods.

The description of the physical system may be particularly advantageously analyzed and, if necessary, corrected by the method implemented on the computer system.

In accordance with another feature of the invention, the computer system includes a storage medium containing the computer program.

In accordance with a further feature of the invention, the program is stored in a computer memory unit.

In accordance with an added feature of the invention, the program is stored in a direct access memory unit.

In accordance with an additional feature of the invention, the program may be transmitted by an electric carrier signal.

In accordance with yet another feature of the invention, the program is downloaded from an electric data network (such as the Internet) to a computer connected to the data network.

In accordance with a concomitant feature of the invention, there is provided a processor programmed to perform the method according to the invention.

With the objects of the invention in view, there is also provided a data carrier containing the computer program.

Other features which are considered as characteristic for the invention are set forth in the appended claims.

Although the invention is illustrated and described herein as embodied in a method and a computer system for structural analysis and correction of a system of differential equations described by a computer language, it is nevertheless not intended to be limited to the details shown, since various modifications and structural changes may be made therein without departing from the spirit of the invention and within the scope and range of equivalents of the claims.

The construction and method of operation of the invention, however, together with additional objects and advantages thereof will be best understood from the following description of specific embodiments when read in connection with the accompanying drawings.

BRIEF DESCRIPTION OF THE DRAWINGS

FIG. 4 is a listing of a controlled system source code of the controlled system of FIG. 1 of the exemplary embodiment;

FIG. 5 is an illustration of a controlled system matrix of the controlled system 1 of FIG. 1 of the exemplary embodiment;

FIG. 6 is a first bipartite graph of the controlled system matrix according to the exemplary embodiment;

FIG. 7 is a visibility range and equation type representation of the first bipartite graph of the exemplary embodiment;

FIG. 10 is a second bipartite graph (according to the exemplary embodiment) set up from the break quantity and selector quantity list representation, and from the first structural equation node, the second structural equation node and the third structural equation node;

FIG. 11 is a diagram showing a perfect match of the second bipartite graph according to the exemplary embodiment;

FIG. 12 is a "simulation run" listing relating to analysis and correction of the sinusoidal source source code, the integrator source code and the controlled system source code according to the exemplary embodiment, FIG. 13 is a regularized integrator source code, produced by the execution of the method of the invention, in the computer program, which replaces the integrator source code of FIG. 3, according to the exemplary embodiment;

FIG. 14 is an illustration of a controlled system matrix regularized with a "break statement" determined from FIG. 13, which replaces the controlled system matrix of FIG. 5, according to an exemplary embodiment;

DESCRIPTION OF THE PREFERRED EMBODIMENTS

Figures 1, 2, 3:
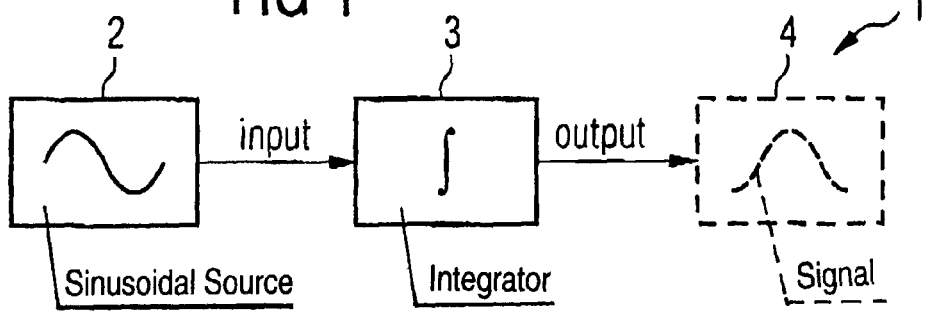
FIG. 1 is a block diagram of a controlled system having a sinusoidal source, an integrator and an output signal according to an exemplary embodiment of the invention.
FIG. 2 is a listing of a sinusoidal source code of the sinusoidal source of FIG. 1 of the exemplary embodiment.
FIG. 3 is a listing of an integrator source code of the integrator 3 of FIG. 1 of the exemplary embodiment.

Referring now to the figures of the drawings in detail and first, particularly to FIG. 1 thereof, there is shown a controlled system 1 having a sinusoidal source 2, an integrator 3 and an output signal 4 according to an exemplary embodiment.

The sinusoidal source 2 is constructed as an alternate voltage source and is connected to the integrator 3. The alternate voltage generated by the sinusoidal source 2 is supplied to the integrator 3 for processing. The integrator 3 integrates the alternate voltage generated by the sinusoidal source 2 over time. The cosine waveform of the alternate voltage generated by the integrator 3 is output as the output signal 4 from the controlled system 1.

A depiction of the controlled system 1, of the sinusoidal source 2 and of the integrator 3 is produced on a computer system by using a programming language. The VHSIC hardware description language (VHDL) (with analog and mixed signal (AMS)) "VHDL-AMS" is used for this pu numerical rpose.

FIG. 2 shows a listing of a sinusoidal source source code 5 of the sinusoidal source 2 of FIG. 1 according to the exemplary embodiment.

The sinusoidal source source code 5, present in the hardware description language "VHDL-AMS", describes the behavior of the sinusoidal source 2.

In line 1 (of FIG. 2), the "entity" with the name "sinus" is declared. In line 2, the output variable "sout" is declared. The "VHDL-AMS" language constructs "port declaration" and "interface quantity declaration" are used herein. Line 3 ends the declaration of the "entity sinus".

Lines 4 to 7 describe the actual behavior of the sinusoidal source 2. In "VHDL-AMS", the behavior of a unit is described within an "architecture declaration". Accordingly, the fourth line declares the "architecture" with the name "behave" with reference to the preceding "entity" declaration "sinus". The fifth line represents the start of the behavior description of the sinusoidal source 2. In the sixth line, the output variable "sout" (declared in line 2) is described in the form of an equation by a sinusoidal oscillation. The "VHDL-AMS" language construct "simple simultaneous statement" is used for this purpose.

The equation E1 represents a first explicit equation, wherein $$E1 : sout = 5.0 * \sin\left(2\pi\pi f + \frac{\pi}{16}\right)$$

Line 7 is the end of the behavior description of the sinusoidal source 2.

FIG. 3 shows a listing of an integrator source code 6 of the integrator 3 of FIG. 1 according to the exemplary embodiment.

Lines 1 to 4 of the integrator source code 6 define the clamping behavior of the integrator 3. Line 1 declares the "entity" with the name "integrator". Line 2 is declares the input variable "inp", and line 3 declares the output variable "outp". Line 4 ends the declaration of the "entity integrator".

The behavior description of the integrator 3 within the integrator source code 6 is carried out in a manner analogous to the sinusoidal source source code 5 within an "architecture" in lines 5 to 8. The "architecture" with the name "behave" is declared (in line 5) with reference to the preceding "entity" declaration "integrator". Line 6 marks the start of the behavior description of the integrator 3. The input variable "inp" of line 2 is placed in a differential relationship (in line 7) with the output variable "outp" of line 3 (in the form of an equation or a "simple simultaneous statement). The relationship defines the integrating action of the integrator, wherein $$E2 : inp = \frac{d}{dt} outp' dot$$

The equation E2 is the second explicit equation. The derivative of a system variable with respect to time is made possible in "VHDL-AMS" by the language construct "DOT". The end of the behavior description of the integrator 3 is reached at line 8.

FIG. 4 shows a listing of a controlled system source code 7 of the controlled system 1 of FIG. 1 according to the exemplary embodiment.

The controlled system source code 7 is a top-level description in which the two components of the controlled system 1 are instantiated. Specifically, the sinusoidal source 2 is instantiated by the sinusoidal source source code 5, and the integrator 3 is instantiated by the integrator source code 6.

Accordingly, the interconnection of the sinusoidal source 2 and the integrator 3 is carried out in a third "VHDL-AMS" description (i.e., in the controlled system source code 7). The "VHDL-AMS" model is built hierarchically.

The declaration of the "entity" with the name "example" is made in lines 1 and 2. The interconnection of the sinusoidal source 2 and of the integrator 3 is carried out within the "architecture" declaration (in lines 3 to 11). Line 3 declares the "architecture" with the name "struct" with reference to the previous "entity" declaration "example". The declaration of the local variables "input", "output" is carried out in line 4. This is required to connect the sinusoidal source 2 to the integrator 3. The "VHDL-AMS" language construct "free quantity declaration" is used. Line 5 represents the start of the structural description of the controlled system source code 7. The sinusoidal source 2 is instantiated and identified by the label "SRC" in lines 6 and 7. In order to instantiate components, the language construct "component instantiation statement" is provided in "VHDL-AMS". The output variable "sout" from the sinusoidal source source code 5 is set equal to the variable "input" (declared locally in the controlled system source code 7) by the language construct of line 7 (i.e, by the "port map aspect"). The language construct "port map aspect" is provided as a part of the "VHDL-AMS" language construct "component instantiation statement".

The equation S1 is a first structural equation, wherein S1: sout=input

The integrator 3 is instantiated and identified by the label "INT" (in lines 9 and 10). The "port map aspect" (in line 10) sets the input variable "inp" of the integrator 3 equal to the local variable "input" of the controlled system source code 7.

The equation S2 is the second structural equation of the present exemplary embodiment, wherein S2: inp=input Furthermore, the language construct "port map aspect" (in line 10) sets the output variable of the integrator 3 "outp" equal to the locally declared variable "output".

The equation S3 is the third structural equation of the present exemplary embodiment wherein S3: outp=output The structural description is completed in the eleventh line of the controlled system source code 7.

In addition, an equation containing the time derivative of the output variables of the integrator 3 "outp'dot" is set up.

The equation is represented by $$outp'dot = \frac{d}{dt}outp.$$

The controlled system 1 is considered in the quiescent state. Accordingly, the time derivative of the output variable of the integrator 3 is set to zero. The equation then assumes the following form:

outp'dot=0.0      A1:

FIG. 5 shows a controlled system matrix 8 of the controlled system 1 of FIG. 1 according to the exemplary embodiment.

The system of equations is subdivided into the structural equations S1, S2, S3, the explicit equations E1, E2, and the equation A1, which determines the behavior of the dynamic variable "outp" of the integrator 3. The system of equations is provided in order to determine the quiescent state of the controlled system 1 and can be represented as:

A*u=b, wherein A is the coefficient matrix, u is the unknown vector and b is the vector of the absolute elements. The unknown vector u is subdivided (in FIG. 5) into the unknowns "input", "output", "sout", "inp", "outp" and "outp'dot".

Each of the columns 2 and 5 of the controlled system matrix 8 have only one value. Therefore, the controlled system matrix 8 is singular. Accordingly, the system of equations A*u=b for determining the quiescent state of the controlled system 1 is unsolvable.

In the method according to the invention, a check is made to see if the controlled system matrix 8 can be improved in such a way that it is solvable (by a modification of the equation A1 that takes the time derivative of the controlled system 1 into account).

Analog hardware description languages provide specific language constructs with which the equations can be modified to determine the time derivatives. In the hardware description language "VHDL-AMS" of the exemplary embodiment, such a language construct (specifically, the "break statement") is used to regularize the controlled system matrix 8. Such a "break statement" is appended (in the exemplary embodiment) in order to transform the unsolvable control system matrix 8 into a solvable controlled system matrix.

FIG. 6 shows a first bipartite graph 9 of the controlled system matrix 8 according to the exemplary embodiment.

The first bipartite graph 9 is subdivided into a set of nodes (illustrated as circles in FIG. 6) and a set of edges (illustrated as connecting lines between the individual nodes).

The nodes illustrated on the left-hand side of FIG. 6 represent the first partition of the first bipartite graph 9. Each node in the first partition of the first bipartite graph 9 stands for one line in the controlled system matrix 8 or for one equation in the system of equations on which the controlled system matrix 8 is based. Accordingly, the first partition of the first bipartite graph 9 is subdivided into a first structural equation node 10, a second structural equation node 11, a third structural equation node 12, a first explicit equation node 13, a second explicit equation node 14 and a time derivative equation node 15.

The nodes illustrated by circles on the right-hand side of FIG. 6 represent the second partition of the first bipartite graph 9. The second partition of the first bipartite graph 9 has the columns of the controlled system matrix 8 and the unknowns of the system of equations on which the controlled system matrix 8 is based. Accordingly, the second partition of the first bipartite graph 9 in the exemplary embodiment is subdivided into the variables "input", "output", "sout", "inp", "outp"and "outp'dot".

The edges (shown in FIG. 6) state which unknowns are contained in which equations of the system of equations on which the controlled system matrix 8 is based. If the coefficient matrix A of the controlled system matrix 8 contains an entry (which is different from zero) at a position, which is in a row i and in a column j, then the first bipartite graph 9 contains an edge $(vx_i, vy_j)$.

In FIG. 6, the first structural equation node 10 has a first edge to the unknown "input" and a further edge to the unknown "sout". The first structural equation node 10 is located in the first place in the first partition of the first bipartite graph 9. The unknown "sout" is located in the third place in the second partition of the first bipartite graph 9. Accordingly, a value different from zero is contained in the position (in the controlled system matrix 8) which belongs to this edge. In this case, this is the value "−1" at the position of the first line and the third column within the coefficient matrix A of the controlled system matrix 8 of FIG. 5.

The second structural equation node 11 has a first edge to the unknown "input" and a second edge to the unknown "inp". The third structural equation node 12 is connected to the unknown "output" by an edge and to the unknown "outp" by a further edge. The first explicit equation node 13 is connected to the unknown "sout" by an edge. The second explicit equation node 14 is connected to the unknown "inp" by an edge, and is connected to the unknown "outp'dot" by a further edge. The time derivative equation node 15 has a common edge with the unknown "outp'dot".

FIG. 7 shows a visibility range and equation type representation 16 of the first bipartite graph 9 according to the exemplary embodiment.

The visibility range and equation type representation 16 of the first bipartite graph 9 positions the nodes of the equations and the nodes of the unknowns of the first bipartite graph 9 on three different levels, and additionally represents a first visibility range 17, a second visibility range 18 and a third visibility range 19. The visibility ranges are placed horizontally beside one another (in FIG. 7) and are represented by squares.

The first structural equation nodes 10, the second structural equation node 11 and the third structural equation node 12 are placed on the uppermost level of the three levels. The first explicit equation node 13 and the second explicit equation node 14 are placed on the central level (of the three levels). The time derivative equation node 15 is placed on the lowest level (of the three levels).

The first visibility range 17 contains the nodes of the unknowns "input" and "output". The second visibility range 18 has the first explicit equation node 13 and the node of the unknown "sout". The third visibility range 19 contains the second explicit equation node 14, the time derivative equation node 15 and the nodes of the unknowns "outp", "inp" and "outp'dot".

The first visibility range 17 corresponds to the visibility range of the controlled system source code 7 which performs the interconnection of the sinusoidal source 2 and the integrator 3. The second visibility range 18 corresponds to the visibility range of the sinusoidal source source code 5. The third visibility range 19 corresponds to the integrator source code 6.

Structural equations contain unknowns from different visibility ranges (as a rule). In the present exemplary embodiment, the first structural equation 10 contains unknowns from the first visibility range 17 and from the second visibility range 18. The second structural equation 11 and the third structural equation 12 each has unknowns from the first visibility range 17 and from the third visibility range 19.

Figure 8:
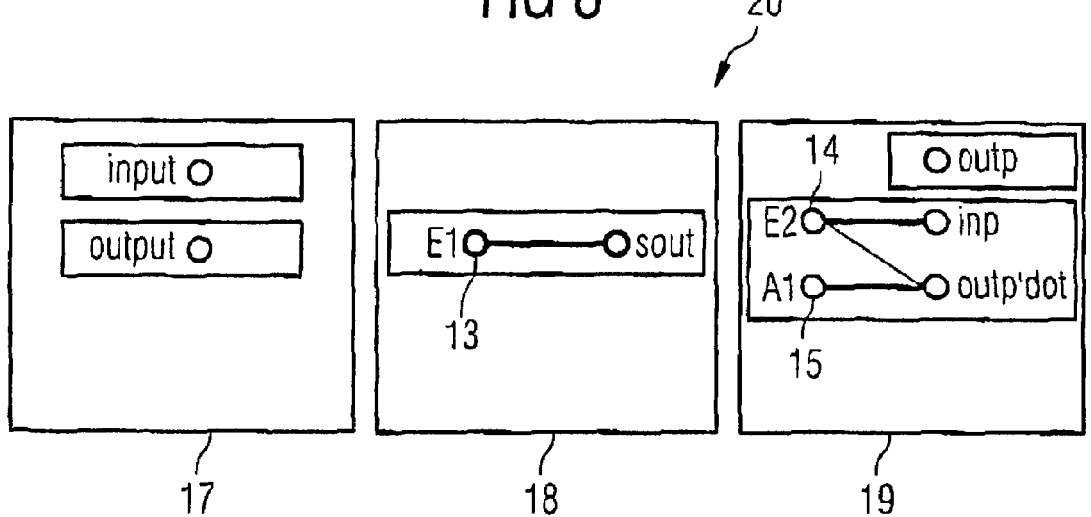
FIG. 8 is a relationship component representation of a controlled system matrix of the exemplary embodiment.

FIG. 8 shows a relationship component representation 20 of a controlled system matrix 8 according to the exemplary embodiment.

The relationship component representation 20 shows the relationship components of the first bipartite graph 9 from which the edges relating to the first structural equation node 10, to the second structural equation node 11 and to the third structural equation node 12 have been removed.

The first visibility range 17, the second visibility range 18 and the third visibility range 19 (in each case) correspond to the visibility ranges of the visibility range and to the equation type representation 16 of the first bipartite graph 9 of FIG. 7.

Furthermore, the edges between the first explicit equation 13 and the unknown "sout", between the second explicit equation 14 and the unknown "inp", and between the time derivative equation 15 and the unknown "outp'dot" are shown in bold in FIG. 8. The bold edges correspond to a maximum matching within each of the relationship components of the modified first bipartite graph 9.

Figure 9:
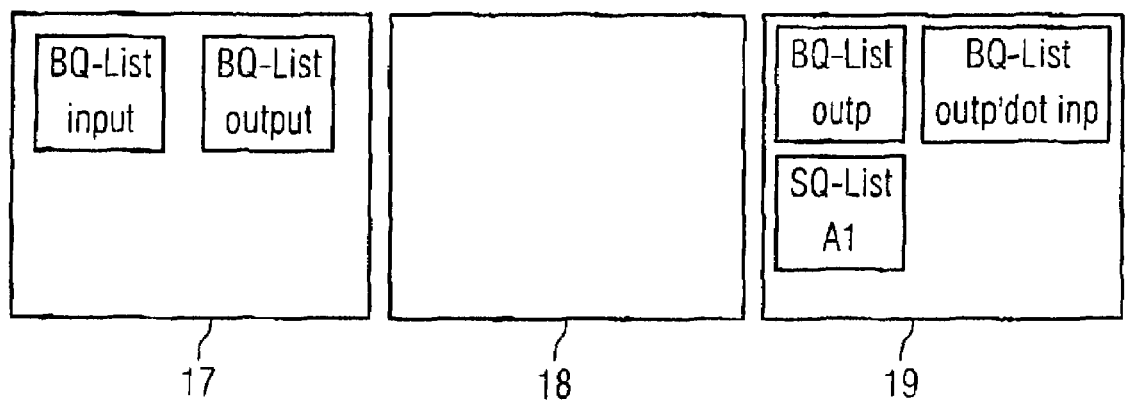
FIG. 9 is a break quantity and selector quantity list representation of the first bipartite graph of the exemplary embodiment.

FIG. 9 shows a break quantity and selector quantity list representation 21 of the first bipartite graph 9 according to the exemplary embodiment.

The break quantity and selector quantity list representation 21 is subdivided into the first visibility range 17, the second visibility range 18 and the third visibility range 19.

The first visibility range 17 has a break quantity list or "BQ list" with the unknown "input" and a further break quantity list with the unknown "output".

The second visibility range 18 (of FIG. 9) contains no break quantity or selector quantity lists.

The third visibility range 19 has a break quantity list with the unknown "outp", a further break quantity list with the unknowns "outp'dot" and "inp" and a selector quantity list ("SQ list") with the time derivative equation 15 identified by "A1".

The selector quantity list is a listing of particularly modifiable equation nodes from the respective visibility range.

A node is matched if it is connected to an edge of a matching.

The modifiable equation nodes are summarized in the selector quantity lists. In order to determine the modifiable equation nodes, the unmatched, modifiable equation nodes of the relationship components are looked for. Then, the selector quantity lists are formed for the unmatched, modifiable equation nodes.

In the present exemplary embodiment, there is no unmatched modifiable equation node. Accordingly, no selector quantity list can be produced.

The break quantity list is a summary of the unmatched unknown nodes and the matched unknown nodes which can be reached via alternate paths.

The break quantity list is built by starting from an unmatched unknown node. Alternate paths are used to determine further unknown nodes.

In the present exemplary embodiment (starting from the unmatched unknown nodes), the break quantity list is compiled with the unknown "input", the break quantity list is compiled with the unknown "output" in the first visibility range 17, and the break quantity list is compiled with the unknown "outp" in the third visibility range 19.

In the exemplary embodiment, there are no alternate paths or alternative nodes relating to the break quantity lists compiled in this way.

The matched, modifiable equation nodes are also considered in addition to the unmatched, modifiable equation nodes of the relationship component representation 20. An unmatched modifiable equation node and an unmatched unknown node are created by deleting the matching edge of such a matched equation node.

A break quantity list can be compiled by following an alternate path by starting from the unmatched unknown nodes. The modifiable equation node, which is now unmatched, is appended to a selector quantity list as a single element.

The edge which connects the time derivative equation node 15 to the unknown node "outp'dot" is deleted by continuing the method in this way.

Accordingly, the matched time derivative equation node 15 becomes an unmatched node. The (now) unmatched time derivative equation node 15 is appended to the selector quantity list of the third visibility range 19 as a single element.

The previously matched unknown node "outp'dot" becomes an unmatched unknown node. Starting from this unmatched unknown node, a further break quantity list is compiled with the unknowns "outp'dot" and "inp" by following the alternate path (out'dot, E2, inp). The break quantity list produced in this way is represented in the third visibility range 19 of FIG. 9.

The second visibility range 18 contains neither unmatched unknown nodes nor modifiable equation nodes. Accordingly neither a selector quantity list nor a break quantity list is compiled in the second visibility range 18.

FIG. 10 shows a second bipartite graph 22 (according to the exemplary embodiment) drawn from the break quantity and selector quantity list representation 21, and also from the first structural equation node 10, the second structural equation node 11 and the third structural equation node 12.

With regard to the first visibility range 17 and the third visibility range 19, the second bipartite graph 22 corresponds to the break quantity and the selector quantity list representation 21.

The second visibility range 18 contains neither a break quantity list nor a selector quantity list. Therefore, the empty second visibility range 18 not need be taken into account in the second bipartite graph 22.

The first structural equation node 10, the second structural equation node 11 and the third structural equation node 12 are appended to the second bipartite graph 22.

The selector quantity list, the first structural equation node 10, the second structural equation node 11 and the third structural equation node 12 form the first partition of the second bipartite graph 22. The break quantity lists form the second partition of the second bipartite graph 22.

The elements of the first partition and of the second partition of the second bipartite graph 22 are then connected to one another by edges. Edges are provided between the selector quantity lists and the break quantity lists which lie in the same visibility range. Furthermore, edges are provided between structural equation nodes and the break quantity lists which have unknowns from the respective structural equations.

The break quantity list with the unknown "outp", the break quantity list with the unknowns "outp'dot" and "inp" lie in the third visibility range (as does the selector quantity list "A1"). Therefore, the selector quantity list "A1" is connected to the aforementioned break quantity lists by an edge in each case.

The first structural equation S1 has the unknown "input". Accordingly, the first structural equation node 10 is connected to the break quantity list "input" by an edge. The second structural equation S2 has the unknown "inp" and the unknown "input". Accordingly, the second structural equation node 11 is connected to the break quantity list "input" and to the break quantity list "outp'dot, inp" by an edge in each case. The third structural equation S3 has the two unknowns "outp" and "output". Therefore, edges are inserted between the third structural equation node 12 and the break quantity lists "output" and "outp".

FIG. 11 shows a perfect matching 23 of the second bipartite graph 22 according to the exemplary embodiment. The perfect matching 23 is illustrated by the edges shown in bold.

A perfect matching 23 is looked for by standard matching algorithms by starting from the second bipartite graph 22 of FIG. 10. Since a perfect matching 23 can be found for the second bipartite graph 22, the system of equations (on which the second bipartite graph 22 is based) can be regularized by "VHDL-AMS" language constructs. Such "VHDL-AMS" language constructs are called "break statements".

Such "break statements" are determined by the edges of the perfect matching which are placed between a selector quantity list and a break quantity list.

The edges of the perfect matching between the structural equations and the break quantity lists have no influence on the determination of the break statements needed for regularization.

There is such a perfect matching 23 for the second bipartite graph 22.

The selector quantity list "A1" is connected to the break quantity list "outp" by an edge in the perfect matching 23. Therefore, break statement is determined from the edge of the perfect matching for the time derivative equation A1 as follows.

Break Statement:
Selector quantity OUTP (time derivative equation A1)
Break quantity OUTP In other words, the time derivative equation A1 is replaced by an equation which is composed of the unknown "outp" and an absolute value defined by a user.

FIG. 12 shows a simulation run listing 24 for the analysis and correction of the sinusoidal source source code 5, the integrator source code 6 and the controlled system source code 7 according to the exemplary embodiment.

The method for analysis and correction of a model of a physical system (for the controlled system 1) of the exemplary embodiment is carried out in the computer system.

In this embodiment, the method steps (shown in FIGS. 5 to 11) are carried out by a computer program set up to execute the method steps. The simulation run listing 24 shows the sequence of the method for the analysis and correction of the model of the controlled system 1 in the computer system. The model of the controlled system 1 is present in the form of the sinusoidal source source code 5, the integrator source code 6 and the controlled system source code 7.

The lines of the simulation run listing 24 are numbered consecutively. Lines 1 to 4 contain information about the configuration of the controlled system matrix 8 (in the computer system), and information about the computer program used.

The start of the simulation of the controlled system 1 is shown in lines 5 to 10 of the simulation run listing 24. The controlled system source code 7 is loaded in line 5 and a standard analysis is used as the basis in line 7. It is established that the system is not DC solvable (in line 8), and it is confirmed (in line 9) that the simulation has been aborted due to the presence of a singular matrix.

The execution of the method shown in FIGS. 6 to 11 is carried out (in lines 11 to 21).

It is established in lines 22 to 29 that a break statement has been found, and that an absolute value of the unknown "outp" will be entered by the user.

In line 30, the absolute value for the unknown "outp" is entered. This value (for the unknown "outp") entered by the user in the exemplary embodiment is: "4.0e−7".

In line 31, the analysis of the model of the controlled system 1 is completed.

In lines 32 to 35, the computer program queries if the description of the controlled system 1, altered in this way, is to be compiled and saved.

FIG. 13 shows a regularized integrator source code 25, which is produced by the execution of the method according to the invention in the computer program. It replaces the integrator source code 6 of FIG. 3, according to the exemplary embodiment.

The regularized integrator source code 25 corresponds to the integrator source code 6 of FIG. 3, except that the "architecture" with reference to the "entity" declaration "integrator" in line 1 contains seven lines and has the name "BEHAVE_BA1".

The "break statement" generated by the computer program by using the absolute value entered by the user is inserted into lines 8 to 10. Lines 8 and 9 include the note that lines 8 to 10 have been supplemented by the computer program "break analyzer" at the date and time listed in line 9. The break statement inserted in line 10 sets the unknown "OUTP" equal to the absolute value "4.0e−7".

FIG. 14 shows a controlled system matrix 26 regularized with the "break statement" (determined from FIG. 13), which replaces the controlled system matrix 8 of FIG. 5, according to an exemplary embodiment.

The regularized controlled system matrix 26 corresponds to the controlled system matrix 8, except that the time derivative equation A1:outp'dot=0.0 in the basic system of equations is replaced by the resultant equation from the break statement outp=4.0E−7.

Figure 15A:
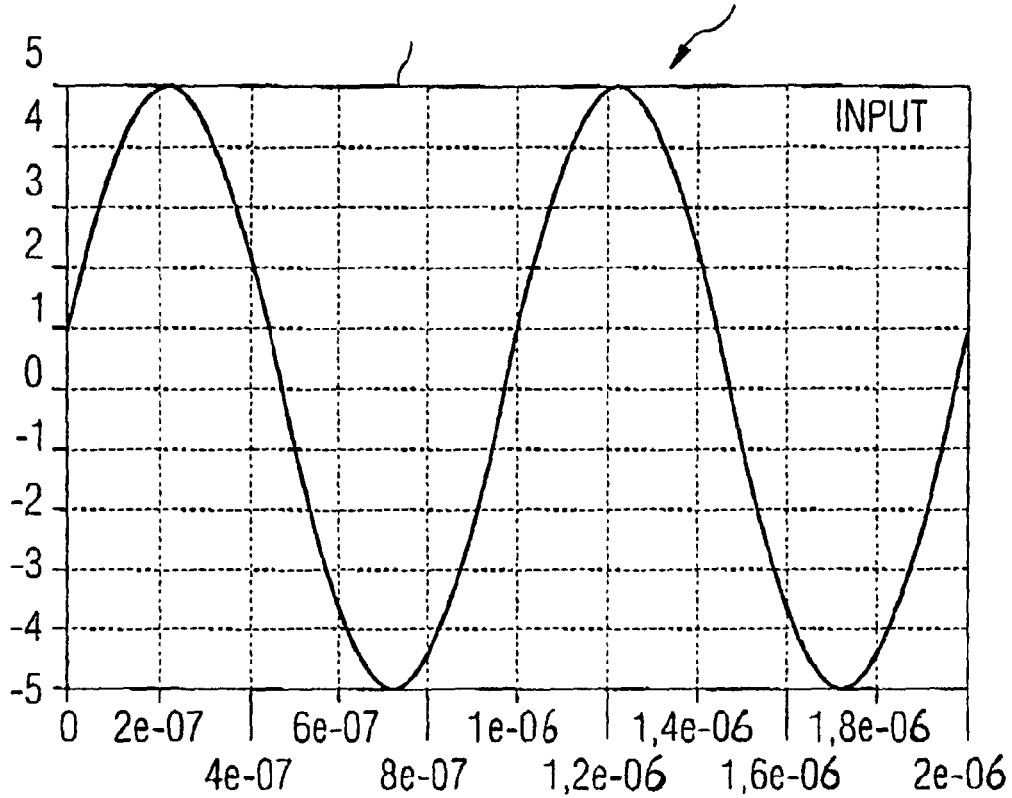
FIG. 15A is a graphical simulation representation with an integrator input voltage waveform according to the exemplary embodiment.
Figure 15B:
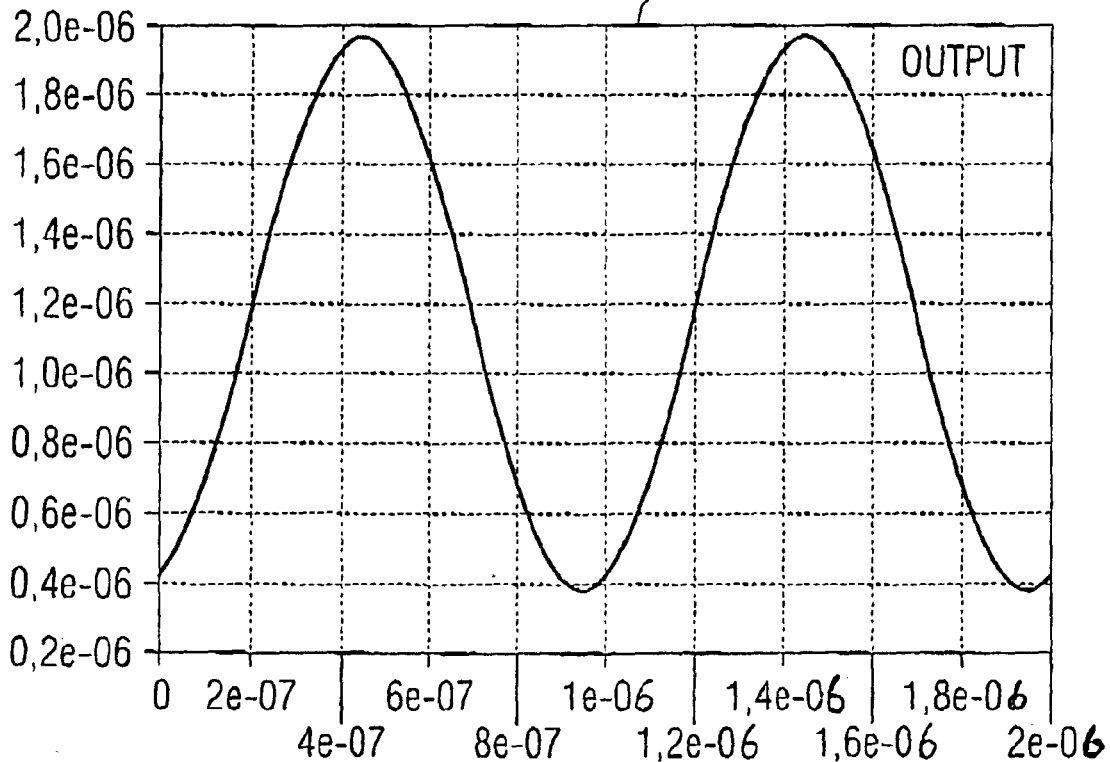
FIG. 15B is a graphical simulation representation with an integrator output voltage waveform according to the exemplary embodiment.

FIG. 15A shows a graphical simulation representation 27 with an integrator input voltage waveform 28. FIG. 15B shows a graphical simulation representation 27 with an integrator output voltage waveform 29.

The integrator input voltage waveform 28 and the integrator output voltage waveform 29 can be calculated by suitable methods by starting from the working point determined by the controlled system matrix 26.

Each of the horizontal axis of the integrator input voltage waveform 28 and the horizontal axis of the integrator output voltage waveform 29 represents a time axis. The voltage is plotted on the vertical axis in each case.

The integrator input voltage waveform 28 represents a harmonic oscillation with a constant amplitude of 5 V and a constant frequency of 1 MHz.

The integrator output voltage waveform 29 is characterized by a constant amplitude of 7.9E−7 V and a constant frequency of 1 MHz. This corresponds to the input voltage integrated over time with a cosine behavior.

In other embodiments, hard-wired circuitry may be used with software instructions to implement the invention, in addition to a computer-readable medium. Thus, embodiments of the invention are not limited to any particular combination of hardware and software.

The term "computer-readable medium" refers to any medium that provides instructions. Such a medium may include but not be limited to, non-volatile media, volatile media, and transmission media. Non-volatile media includes, optical and magnetic disks. Volatile media may include dynamic memory.

Common forms of computer-readable media include a floppy disk, flexible disk, hard disk, magnetic tape, and any other magnetic medium, a CD-ROM or other optical mediums, and a RAM, a PROM, and EPROM, a FLASH-EPROM, other memory chips, and any other medium from which a computer can read.

We claim:

1. A method for structural analysis and correction of a system of differential equations describing a physical system, the system of differential equations being in a computer language in a computer system, the method which comprises the steps of:
   a) classifying equations of the system of differential equations into structural equations, explicit equations and modifiable equations;
   b) setting up a first bipartite graph from the system of differential equations, wherein nodes of a first partition correspond to the equations of the system of differential equations and nodes of a second partition correspond to "unknowns";
   c) removing nodes corresponding to the structural equations and associated edges from the first bipartite graph;
   d) determining a "maximum matching" for the first bipartite graph after step c);
   e) setting up an empty second bipartite graph;
   f) determining unmatched nodes corresponding to a modifiable equation from the first bipartite graph;
   g) generating respective nodes in a first partition of a second bipartite graph for each node determined in step f);
   h) determining further nodes corresponding to the modifiable equation from the first bipartite graph by starting from the nodes determined in step f) and following alternate paths;
   i) appending the nodes determined in step h) to the nodes generated in step g);
   j) determining unmatched nodes corresponding to an unknown from the first bipartite graph;
   k) creating respective nodes in a second partition of the second bipartite graph for each node determined in step j);
   l) determining other nodes corresponding to the unknown from the first bipartite graph by starting from the unmatched nodes determined in step j) and using alternate paths;
   m) appending the other nodes determined in step l) to the nodes of the second bipartite graph created in step k);
   n) determining matched nodes corresponding to the modifiable equation from the first bipartite graph;
   o) deleting a matched edge from the nodes determined in step n);
   p) producing respective nodes in the first partition of the second bipartite graph for the nodes of the first bipartite graph determined in step n);
   q) determining respective nodes in the second partition of the second bipartite graph for each unmatched node corresponding to the unknown in the first bipartite graph;
   r) determining additional nodes corresponding to the unknown by starting from the unmatched nodes corresponding to the unknown in the first bipartite graph and following alternate paths;
   s) appending the nodes determined in step r) to the nodes of the second bipartite graph determined in step q);
   t) generating respective nodes in the first partition of the second bipartite graph for each structural equation;
   u) connecting respective nodes of the first partition of the second bipartite graph by an edge to respective nodes of the second partition of the second bipartite graph present in the same respective visibility range;
   v) connecting the respective nodes generated in step t) by an edge to respective nodes of the second partition of the second bipartite graph, if one of the unknowns corresponding to the respective node of the second partition is contained in a structural equation corresponding to a respective node of the first partition;
   w) determining a "maximum matching" of the second bipartite graph; and
   x) saving a corrected system of differential equations describing the physical system in view of the results of steps a-w, as a corrected model of the physical system.

2. The method according to claim 1, which further comprises carrying out the following steps w1) to w5) after step w), if the maximum, matching determined in step w) is a perfect matching:
   w1) determining edges of the perfect matching, connecting the nodes of the first partition of the second bipartite graph determined in steps g) and p) to respective nodes of the second partition of the second bipartite graph;
   w2) selecting a modifiable equation from the nodes of the first partition of the second bipartite graph connected by the edges determined in step w1);
   w3) selecting an unknown from the nodes of the second partition of the second bipartite graph connected by the edges determined in step W1);
   w4) defining a numerical value for the unknown selected in step w3);
   w5) replacing the modifiable equation selected in step w2) by an equation allocating the numerical, value defined in step w4) to the unknown selected in step w3); and
   w6) repeating steps w2) to w5) for further edges to be determined in step w1).

3. The method according to claim 1, wherein the physical system is an electric circuit having at least one circuit element.

4. The method according to claim 1, wherein the system of differential equations describing a physical system is coded in a hardware description language.

5. The method according to claim 4, wherein the hardware description language is one of a "VHDL-AMS" and a "Verilog-AMS".

6. A computer system, comprising:
   a computer-readable medium having computer-executable instructions for performing a method of structural analysis and correction of a system of differential equations describing a physical system, the system of differential equations being in a computer language in a computer system, the method comprising the steps of:
   a) classifying equations of the system of differential equations into structural equations, explicit equations and modifiable equations;
   b) setting up a first bipartite graph from the system of differential equations, wherein nodes of a first partition correspond to the equations of the system of differential equations and nodes of a second partition correspond to "unknowns";
   c) removing nodes corresponding to the structural equations and associated edges from the first bipartite graph;
   d) determining a "maximum matching" for the first bipartite graph after step a);
   e) setting up an empty second bipartite graph;
   f) determining unmatched nodes corresponding to a modifiable equation from the first bipartite graph;
   q) generating respective nodes in a first partition of a second bipartite graph for each node determined in step f);
   h) determining further nodes corresponding to the modifiable equation from the first bipartite graph by starting from the nodes determined in step f) and following alternate paths;
   i) appending the nodes determined in step h) to the nodes generated in step g);
   j) determining unmatched nodes corresponding to an unknown from the first bipartite graph;
   k) creating respective nodes in a second partition of the second bipartite graph for each node determined in step j);
   l) determining other nodes corresponding to the unknown from the first bipartite graph by starting from the unmatched nodes determined in step j) and using alternate paths;
   m) appending the other nodes determined in step l) to the nodes of the second bipartite graph created in step k);
   n) determining matched nodes corresponding to the modifiable equation from the first bipartite graph;
   o) deleting a matched edge from the nodes determined in step n);
   p) producing respective nodes in the first partition of the second bipartite graph for the nodes of the first bipartite graph determined in step n);
   q) determining respective nodes in the second partition of the second bipartite graph for each unmatched node corresponding to the unknown in the first bipartite graph;
   r) determining additional nodes corresponding to the unknown by starting from the unmatched nodes corresponding to the unknown in the first bipartite graph and following alternate paths;
   s) appending the nodes determined in step r) to the nodes of the second bipartite graph determined in step q);
   t) generating respective nodes in the first partition of the second bipartite graph for each structural equation;
   u) connecting respective nodes of the first partition of the second bipartite graph by an edge to respective nodes of the second partition of the second bipartite graph present in the same respective visibility range;
   v) connecting the respective nodes generated in step t) by an edge to respective nodes of the second partition of the second bipartite graph, if one of the unknowns corresponding to the respective node of the second partition is contained in a structural equation corresponding to a respective node of the first partition;
   w) determining a "maximum matching" of the second bipartite graph; and
   x) saving a corrected system of differential equations describing the physical system in view of the results of steps a-w, as a corrected model of the physical system;
   a processor tar executing the method of structural analysts and correction of a system of differential equations describing a physical system, of the computer readable medium; and
   storage device for saving the corrected system of differential equations.

7. The computer system according to claim 6, wherein the computer-executable instructions are stored in a computer memory unit.

8. The computer system according to claim 7, wherein the computer-executable instructions are stored in a direct access memory unit.

9. The computer system according to claim 6, wherein the computer-executable instructions are transmitted by an electrical carrier signal.

10. The computer system according to claim 6, wherein the computer-executable instructions are downloaded from an electronic network to a computer coupled to the electronic network.

* * * * *

UNITED STATES PATENT AND TRADEMARK OFFICE
CERTIFICATE OF CORRECTION

| | | |
|---|---|---|
| PATENT NO. | : 7,272,543 B2 | Page 1 of 1 |
| APPLICATION NO. | : 10/273520 | |
| DATED | : September 18, 2007 | |
| INVENTOR(S) | : Diana Estevez-Schwarz et al. | |

It is certified that error appears in the above-identified patent and that said Letters Patent is hereby corrected as shown below:

<u>Column 19,</u>

Line 3, "maximum, matching determined" should read -- maximum matching determined --

Line 14, "W1" should read -- w1 --

Line 18, "numerical, value defined" should read --numerical value defined --

Line 49, "after step a" should read -- after step c --

<u>Column 20,</u>

Line 45, "a processor tar executing" -- a processor for executing --

Signed and Sealed this

Fourth Day of March, 2008

JON W. DUDAS
*Director of the United States Patent and Trademark Office*